(12) United States Patent
Davis et al.

(10) Patent No.: US 9,911,716 B2
(45) Date of Patent: Mar. 6, 2018

(54) POLYGON DIE PACKAGING

(71) Applicant: International Business Machines Corporation, Armonk, NY (US)

(72) Inventors: Taryn J. Davis, Beacon, NY (US); Tuhin Sinha, Hackensack, NJ (US)

(73) Assignee: International Business Machines Corporation, Armonk, NY (US)

( * ) Notice: Subject to any disclaimer, the term of this patent is extended or adjusted under 35 U.S.C. 154(b) by 66 days.

(21) Appl. No.: 14/609,237

(22) Filed: Jan. 29, 2015

(65) Prior Publication Data

US 2016/0225742 A1 Aug. 4, 2016

(51) Int. Cl.
*H01L 25/065* (2006.01)
*H01L 29/06* (2006.01)
(Continued)

(52) U.S. Cl.
CPC ........ *H01L 25/0655* (2013.01); *H01L 21/563* (2013.01); *H01L 23/3675* (2013.01); *H01L 23/42* (2013.01); *H01L 25/50* (2013.01); *H01L 29/0657* (2013.01); *H01L 23/04* (2013.01); *H01L 23/10* (2013.01); *H01L 23/49816* (2013.01);
(Continued)

(58) Field of Classification Search
CPC ..... H01L 23/13; H01L 23/36; H01L 23/3121; H01L 23/3142; H01L 23/5386; H01L 23/49503; H01L 24/06; H01L 24/09; H01L 24/97; H01L 25/50; H01L 25/0652; H01L 21/78; H01L 21/304; H01L 2224/16225; H01L 2224/73204; H01L 2224/73253;
(Continued)

(56) References Cited

U.S. PATENT DOCUMENTS 4,499,607 A 2/1985 Higgins
5,710,071 A 1/1998 Beddingfield et al.
(Continued)

OTHER PUBLICATIONS

S. Sidiropoulos, "High Performance Inter-Chip Signaling," Technical Report: CSL-TR-760, Computer Systems Laboratory, Departments of Electrical Engineering and Computer Science, Stanford University, Apr. 1998.

(Continued)

*Primary Examiner* — Cheung Lee
*Assistant Examiner* — Stephen C Smith
(74) *Attorney, Agent, or Firm* — Matthew C. Zehrer (57) ABSTRACT

A lidded or lidless flip-chip package includes two or more polygon shaped dies. The polygon dies may be interconnected to a substrate or to an interposer interconnected to a substrate. The interposer may be similarly shaped with respect to the polygon die(s). For the lidless or lidded package, the package may include underfill under the polygon dies surrounding associated interconnects. For the lidded package, the package may also include thermal interface materials, seal bands, and a lid. The polygon die package reduces shear stress between the polygon die/interposer and associated underfill as compared to square or rectangular shaped die/interposer of the same area. The polygon dies further maximize the utilization of a wafer from upon which the polygon dies are fabricated. The multi polygon die package may allow for a significant reduction of the polygon die to polygon die relative to the spacing and may reduce signal interconnect time.

2 Claims, 9 Drawing Sheets

(51) Int. Cl.
*H01L 23/42* (2006.01)
*H01L 23/367* (2006.01)
*H01L 21/56* (2006.01)
*H01L 25/00* (2006.01)
*H01L 23/498* (2006.01)
*H01L 23/10* (2006.01)
*H01L 23/04* (2006.01)

(52) U.S. Cl.
CPC ............... *H01L 2224/16225* (2013.01); *H01L 2224/73204* (2013.01); *H01L 2224/73253* (2013.01); *H01L 2924/15311* (2013.01); *H01L 2924/16152* (2013.01)

(58) Field of Classification Search
CPC . H01L 2924/15311; H01L 2924/16152; H01L 29/0657
See application file for complete search history.

(56) References Cited

U.S. PATENT DOCUMENTS

| | | | |
|---|---|---|---|
| 5,834,843 A | 11/1998 | Mori et al. | |
| 6,030,885 A | 2/2000 | Bothra | |
| 6,407,434 B1 | 6/2002 | Rostoker et al. | |
| 6,462,398 B1 | 10/2002 | Jojiki | |
| 7,208,346 B2 | 4/2007 | Lee | |
| 7,608,919 B1 | 10/2009 | Bernstein et al. | |
| 8,193,613 B2 | 6/2012 | Wang et al. | |
| 2013/0249079 A1* | 9/2013 | Lee | H01L 21/6836 257/737 |
| 2014/0217557 A1* | 8/2014 | Chen | H01L 23/10 257/620 |
| 2014/0321093 A1* | 10/2014 | Pande | H01G 11/22 361/807 |
| 2015/0008571 A1* | 1/2015 | Gallegos | H01L 23/562 257/690 |
| 2015/0145115 A1* | 5/2015 | Liu | H01L 24/92 257/712 |
| 2015/0179609 A1* | 6/2015 | Holm | H01L 23/49811 257/741 |
| 2015/0206807 A1* | 7/2015 | Ahn | H01L 24/97 257/738 |
| 2016/0042978 A1* | 2/2016 | Wang | H01L 25/50 257/773 |

OTHER PUBLICATIONS

X. Gu et al., "High-density silicon carrier transmission line design for chip-to-chip interconnects," IEEE 20th Conference on Electrical Performance of Electronic Packaging and Systems (EPEPS), 2011.

\* cited by examiner

POLYGON DIE PACKAGING

FIELD

Embodiments of invention generally relate to semiconductor devices, design structures for designing a semiconductor device, and semiconductor device packaging methods. More particularly, embodiments relate to the packaging of polygon dies.

BACKGROUND

Semiconductors have traditionally scaled in accordance with the Moore's Law wherein packing more and more transistors (at a reduced pitch) over the same area leads to an overall improvement in the device performance at a reduced cost. However, as the technology nodes are shrinking to tens of nanometers, the development costs associated with increasing semiconductor density has been steadily increasing. Therefore, in order to offset the development costs associated with traditional semiconductor scaling, 3D packages (stacked dies, dies on interposers, etc.) have been considered.

However, developing 3D semiconductor packaging technologies present unique challenges with regards to optimizing the thermo-mechanical performance and ensure device reliability. For example, there is a growing need to reduce the chip package interaction (CPI) shear stresses between the die/interposer and associated underfill to offset the added stress caused by the increasing package complexity. Additionally, the cost to produce such packages should be minimum to stay competitive in the market.

Quadrilateral (especially square and rectangle) shaped die/interposers have high CPI shear stress concentrations at the corners between the underfill and the die/interposer. Reduction of this underfill to die/interposer shear stresses is limited by the properties of the existing package component materials and by geometric constraints. Additionally, because the die shape is restricted to square/rectangular forms, system optimization can only be obtained through substrate modifications, which is limited by the properties of existing substrate materials.

SUMMARY

In an embodiment of the present invention, a multi-die packaging method includes interconnecting a central polygon die to a substrate, interconnecting a plurality of outer polygon dies to the substrate arranged about the central polygon die, and applying an underfill between the central polygon die and the substrate and applying underfill between the plurality outer polygon dies and the substrate.

In another embodiment of the present invention, a multi-die packaging method includes interconnecting a central polygon die to a polygon interposer, interconnecting a plurality of outer polygon dies to the polygon interposer arranged about the central polygon die, applying an underfill between the central polygon die and the polygon interposer and applying underfill between the plurality outer polygon dies and the polygon interposer, interconnecting the polygon interposer with a substrate, and applying an underfill between the polygon interposer and the substrate.

In yet another embodiment of the present invention, a multi-die package includes a central polygon die upon a substrate, a plurality of outer polygon dies upon the substrate arranged about the central polygon die, and underfill between respective polygon dies and the substrate.

These and other embodiments, features, aspects, and advantages will become better understood with reference to the following description, appended claims, and accompanying drawings.

BRIEF DESCRIPTION OF THE DRAWINGS

So that the manner in which the above recited features of the present invention are attained and can be understood in detail, a more particular description of the invention, briefly summarized above, may be had by reference to the embodiments thereof which are illustrated in the appended drawings.

It is to be noted, however, that the appended drawings illustrate only typical embodiments of this invention and are therefore not to be considered limiting of its scope, for the invention may admit to other equally effective embodiments.

The drawings are not necessarily to scale. The drawings are merely schematic representations, not intended to portray specific parameters of the invention. The drawings are intended to depict only exemplary embodiments of the invention. In the drawings, like numbering represents like elements.

DETAILED DESCRIPTION

Detailed embodiments of the claimed structures and methods are disclosed herein; however, it can be understood that the disclosed embodiments are merely illustrative of the claimed structures and methods that may be embodied in various forms. These exemplary embodiments are provided so that this disclosure will be thorough and complete and will fully convey the scope of this invention to those skilled in the art. In the description, details of well-known features and techniques may be omitted to avoid unnecessarily obscuring the presented embodiments.

Embodiments relate to packaging of multiple polygon semiconductor dies, chips, integrated circuits, etc. More particularly a lidded or lidless flip-chip package includes two or more polygon shaped die on top of it, each of which has at least 5 sides (n>=5). The polygon dies may be interconnected to a substrate or to an interposer interconnected to a substrate. The interposer may be similarly shaped with respect to the polygon die(s) and may be silicon, glass, or an organic material. For the lidless or lidded package, the package may include underfill under the polygon dies surrounding associated interconnects. The substrate(s), may be coreless, cored, organic, ceramic, etc. For the lidded package, the package may also include thermal interface materials (TIMs), seal bands, and lid(s).

The polygon die package reduces CPI shear stress between the polygon die/interposer and associated underfill as compared to square or rectangular shaped die/interposer of the same area. In an embodiment, the polygon dies are hexagonal to maximize the utilization of a wafer from upon which the polygon dies are fabricated. The multi polygon die package may allow for a significant reduction of the polygon die to polygon die spacing relative to the spacing of square or rectangular dies of the same area. This reduction in polygon die to polygon die spacing may reduce signal interconnect time which increases system performance.

Referring now to the FIGs, wherein like components are labeled with like numerals, exemplary embodiments of a multi polygon die package are shown, and will now be described in greater detail below. It should be noted that some of the FIGs depict various cross section views, top views, etc. Furthermore, it should be noted that while this description may refer to components in the singular tense, more than one component may be depicted throughout the figures. The specific number of components depicted in the figures and the cross section orientation was chosen to best illustrate the various embodiments described herein.

Figure 1:
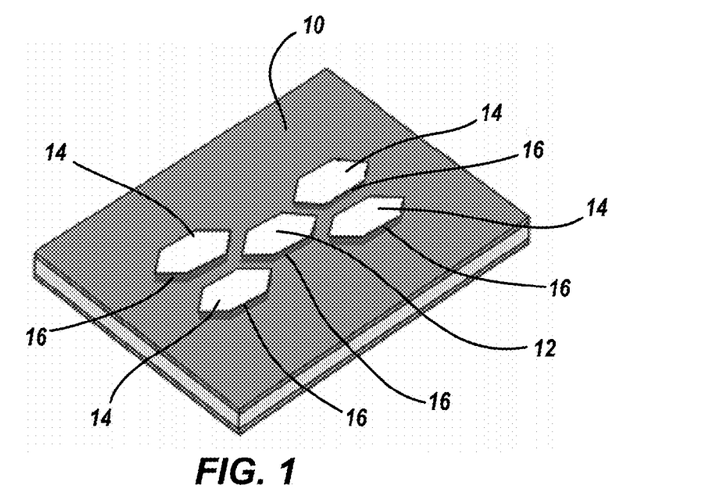
FIG. 1 depicts a substrate interconnected with a central polygon die and with a plurality of outer polygon dies arranged about the central polygon die, in accordance with various embodiments of the present invention.

FIG. 1 depicts a substrate 10 interconnected with a central polygon die 12 and with a plurality of outer polygon dies 14 arranged about the central polygon die 12. In embodiments, substrate 10 may be a carrier, laminate, etc. electrically connected to a system board of an electronic device such as a computer, server, mobile device, tablet, etc. Unless otherwise indicated, a die may be an integrated circuit, semiconductor chip, processor, microchip, etc. Substrate 10 may be an organic carrier, ceramic carrier, core carrier, coreless carrier, etc. and provides mechanical support for the multiple dies and electrical paths from the upper surface of substrate 10 to the opposing side of substrate 10. Interconnects electrically connect respective dies to the upper side of substrate 10 and may be a wire bond, solder bond, stud, pin, conductive ball, conductive button, etc. Underfill 16 may be electrically-insulating and substantially surround the interconnects, thereby electrically isolating individual interconnects, and may provide mechanical support between the associated die and substrate 10. Underfill 16 may also prevent damage to individual interconnects due to thermal expansion mismatches between the associated die and substrate 10.

Figure 2:
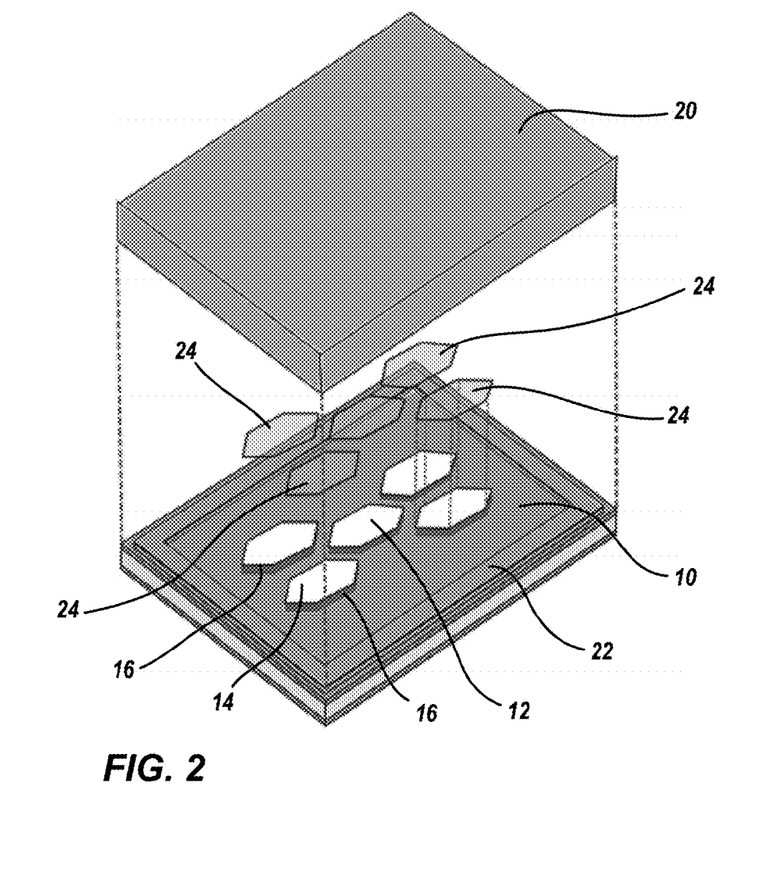
FIG. 2 depicts a multi polygon die package, in accordance with various embodiments various embodiments of the present invention.

When the multiple dies are seated upon substrate 10, a reflow process may be performed to join interconnects to electrical contacts of the respective dies and substrate 10. In some implementations, as shown in FIG. 2, after the multiple dies are seated to substrate 10 a lid 20 may be attached to substrate 10 with a seal band 22 to cover the multiple dies. The seal band 22 may be applied to the substrate 10 around the perimeter of the multiple dies. Generally, the seal band 22 adheres the lid 22 with the substrate 10. During operation of the electronic device, heat may need to be removed from each respective die. In this situation, lid 20 may be both a cover and a conduit for heat transfer. As such, a thermal interface material (TIM) 24 may thermally join lid 20 and respective dies. TIM 24 may be a thermal grease, gel, or other similar compliant heat transferring material and may be applied upon respective dies or upon die-aligned locations on the underside of cover 20.

Substrate 10 may provide a base on which the plurality dies are mounted and electrically connected thereto via a plurality of interconnects (e.g. solder, pillars, wire bonds, etc.). Substrate 10 may be composed of ceramics or organic materials. If organic, substrate 10 may include multiple layers of metallization and dielectric materials. Depending upon the configuration of layers, substrate 10 may be a coreless, thin core, standard core, etc. carrier. The dielectric materials may be, for example, epoxy resin with or without fiberglass fill. In various embodiments, substrate 10 may interconnect with other electronic system components such as a socket (pin grid array, land grid array, ball grid array, etc.), or other system board connector. In various embodiments, substrate 10 may include other devices, for example, surface mount devices (e.g. capacitors, resistors, etc.).

Die 12 and/or dies 14 may be, for example, a microchip, microprocessor, graphic processor, combined processor and graphics processor, application specific integrated circuit (ASIC), system on a chip (SOC), three dimensional integrated circuit, system on insulator (SOI), etc. In one embodiment, substrate 10 may include a homogenous chip set wherein each die 12 and/or dies 14 are similar to one another. In another embodiment, substrate 10 may utilize a heterogeneous chip set wherein one or more die 12 and/or dies 14 are each different relative thereto. In another embodiment, substrate 10 may utilize a combination homogenous and heterogeneous chip set where one or more first die types are utilized with one or more second die types. Each die 12 and die 14 are generally polygonal shaped with n-sides (n>5) and may be herein referred generically as polygon die. In a particular embodiment, die 12 and the dies 14 are hexagonal. In embodiments, die 12 and/or dies 14 are flip chip dies.

In embodiments, lid 20 is juxtaposed and generally aligned with the multiple polygon dies when attached to substrate 10 by seal band 22. In an embodiment, lid 20 may be indirectly attached to substrate 10 (e.g., via seal band 22 applied to a stiffing frame, etc.). In certain embodiments, the lid 20 may be thermally attached to the multiple polygon dies. Thermally attached is the ability for heat to transfer between associated components to provide for sufficient cooling of the multiple dies. In various embodiments, lid 20 may be made utilizing materials having high thermal conductivity (e.g. copper, nickel, stainless steel, titanium, aluminum, etc.).

Thermal interface material 24 may be juxtaposed between respective polygon dies and lid 20. Thermal interface material 24 generally reduces air gaps between respective polygon dies and lid 20, thereby increasing heat transfer away from the polygon dies. Thermal interface material 20 may be a thermal gel, thermal compound, thermal paste, heat paste, etc. In yet another embodiment, the thickness of thermal interface materials 24 are generally minimized. In certain embodiments, thermal interface material 206 is composed of metallic materials, such as silicone rubber mixed with aluminum and zinc oxide. Other compliant base materials other than silicone rubber and thermally conductive materials may be used.

Figure 3:
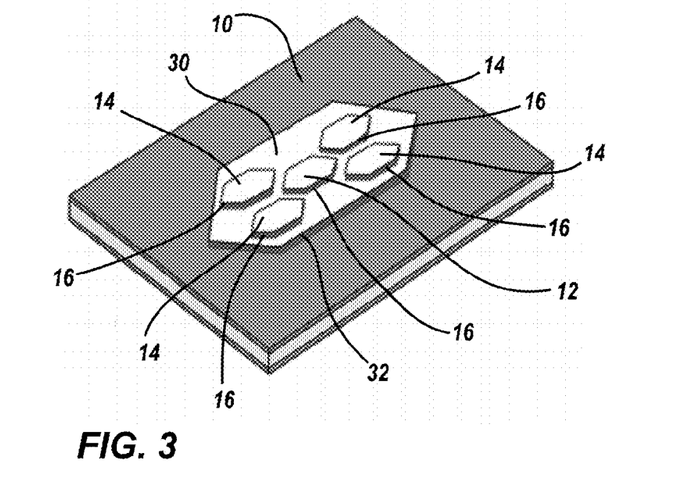
FIG. 3 depicts a substrate interconnected with a polygon interposer including a central polygon die and with a plurality of outer polygon dies arranged about the central polygon die, in accordance with various embodiments of the present invention.

FIG. 3 depicts substrate 10 interconnected with a polygon interposer 30. Interposer 30 is interconnected with central polygon die 12 and with a plurality of outer polygon dies 14 arranged about the central polygon die 12. Interposer 30 is an electrical interface that routes and spreads connections from die 12 and dies 14 to a wider pitch to connect to substrate 10. In embodiments, interposer 30 may be a carrier, laminate, etc. electrically connected to substrate 10. Interposer 30 provides mechanical support for the multiple dies and electrical paths from the upper surface of interposer 30 to the opposing side of interposer 30. Interconnects electrically connect respective dies to the upper side of interposer 30 and may be a wire bond, solder bond, stud, pin, conductive ball, conductive button, etc. Underfill 16 may be electrically-insulating and substantially surround the interconnects, thereby electrically isolating individual interconnects, and may provide mechanical support between the associated die and interposer 30. Underfill 16 may also prevent damage to individual interconnects due to thermal expansion mismatches between the associated die and interposer 30. Likewise, additional interconnects electrically connect substrate 10 to the lower side of interposer 30 and may be a wire bond, solder bond, stud, pin, conductive ball, conductive button, etc. Underfill 32 may be electrically-insulating and substantially surround the interconnects, thereby electrically isolating individual interconnects, and may provide mechanical support between substrate 10 and interposer 30. Underfill 32 may also prevent damage to individual interconnects due to thermal expansion mismatches between the interposer 30 and substrate 10.

Figure 4:
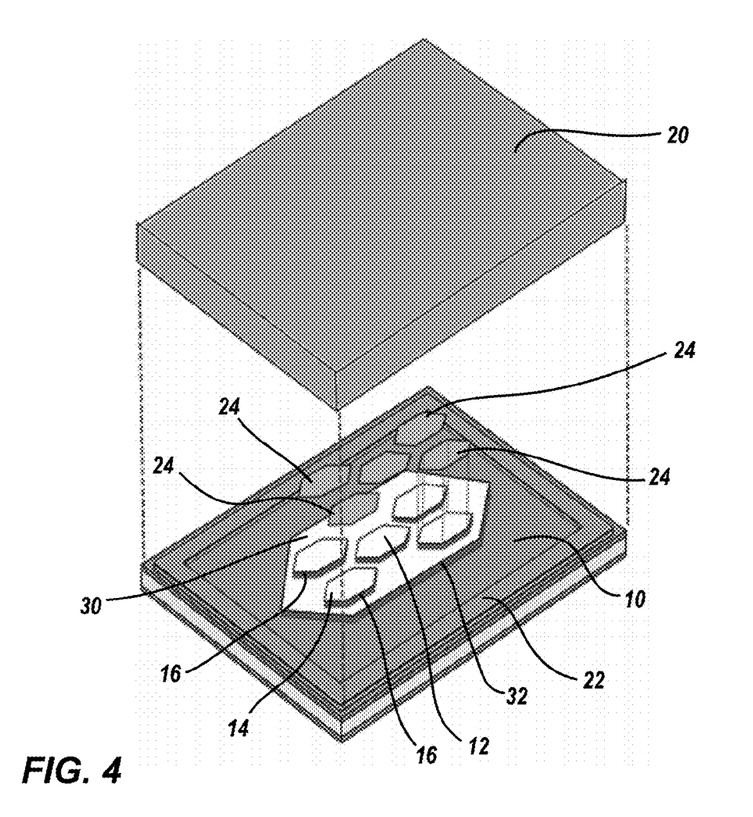
FIG. 4 depicts a multi polygon die package, in accordance with various embodiments various embodiments of the present invention.

When the multiple dies are seated upon interposer 30, a first reflow process may be performed to join the respective dies and interposer 30 and a second reflow process may be performed to join interposer 30 to substrate 10. In embodiments, the first and second reflow processes may be performed serially or simultaneously. In some implementations, as shown in FIG. 4, after the interposer 30 is joined to substrate 10, a lid 20 may be attached to substrate 10 with a seal band 22 to cover the multiple dies. The seal band 22 may be applied to the substrate 10 around the perimeter of the interposer 30.

Figure 5:
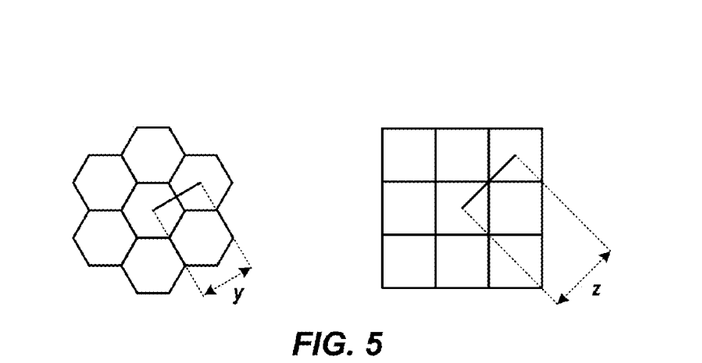
FIG. 5-FIG. 7 depict exemplary advantages of a multi polygon die package, in accordance with various embodiments various embodiments of the present invention.

FIG. 5 depicts an exemplary advantage of a multi polygon die package. The multi polygon die package may allow for a significant reduction of the polygon die to polygon die spacing relative to the spacing "y" relative to the die to die spacing "z" of square or rectangular dies of the same area. This reduction in polygon die to polygon die spacing may reduce signal interconnect time which increases system performance. Further, electrical loss reduction may be achieved as it is generally proportional to the reduction in die to die spacing.

Figure 6:
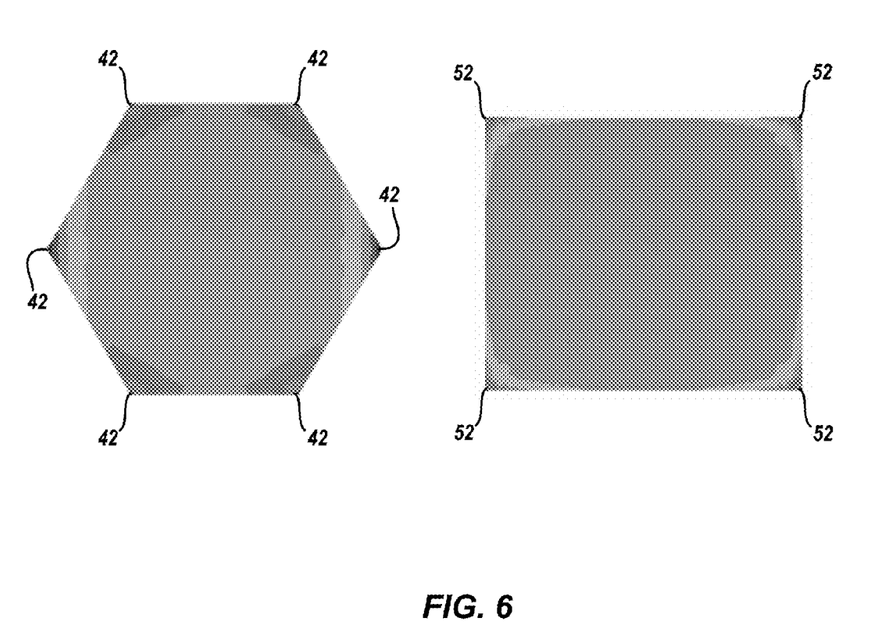

FIG. 6 depicts an exemplary advantage of a multi polygon die package. The multi polygon die package may allow for reduced CPI shear stresses between the polygon die and substrate 10, reduced CPI shear stresses between the polygon die and interposer 30, and/or reduced CPI shear stress between interposer 30 and substrate 10. The quadrilateral shaped die has relatively high CPI shear stress concentrations at the corners 52. The additional corners 42 of reduces the CPI shear stress concentrations on underfill 16 between the die and interposer 30. Likewise additional corners of polygon interposer 30 reduce CPI shear stress concentrations on underfill 32 between the interposer 30 and substrate. Such reduction of CPI shear stress may be particularly useful when the underfill 16, 32 materials have a different coefficient of thermal expansion relative to the materials of substrate 10, dies 12, 14, and/or interposer 30.

Figure 7:
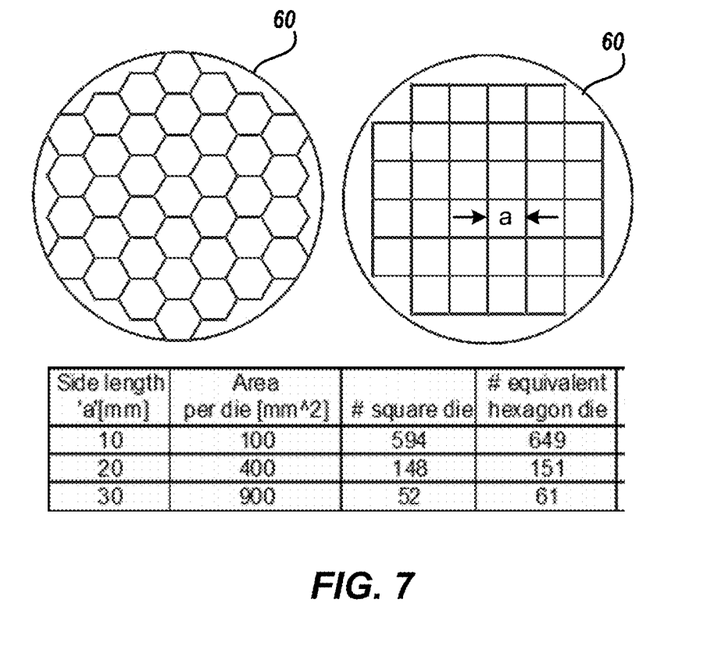

FIG. 7 depicts an exemplary advantage of a multi polygon die package. The multi polygon die package may allow for increased polygon dies to be fabricated per wafer 60. In a particular example, illustrated in FIG. 7, an increased number of hexagon dies may be fabricated upon wafer 60 as compared to the number of square dies of width "a" of the same die area may be fabricated upon wafer 60. With the increased die output and a substantially similar wafer 60 cost of fabrication, the price per polygon die is therefore reduced.

Figure 8:
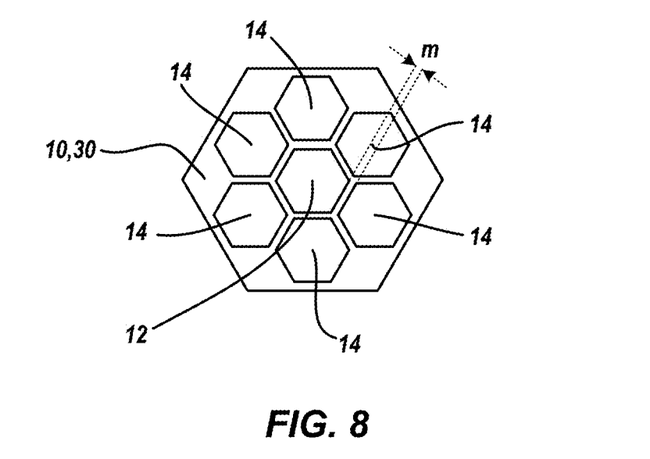
FIG. 8 depicts a top view of a polygon interposer including a central polygon die and with a plurality of outer polygon dies arranged about the central polygon die, in accordance with various embodiments of the present invention.

FIG. 8 depicts a top view of a polygon interposer 30 including central polygon die 12 and with a plurality of outer polygon dies 14 arranged about the central polygon die 12. Dies 14 may be arranged about die 12. In embodiments, an underfill-width "m" separates die 12 and dies 14 from one another, respectively. Generally, the underfill-width "m" is a sufficient width to allow for underfill 16 to be applied under respective dies without contacting a neighboring underfill 16. Further, as is exemplarily shown in FIG. 8, a particular multi polygon die package includes a central hexagonal die 12 fully surrounded by hexagonal outer dies 14.

Figure 9:
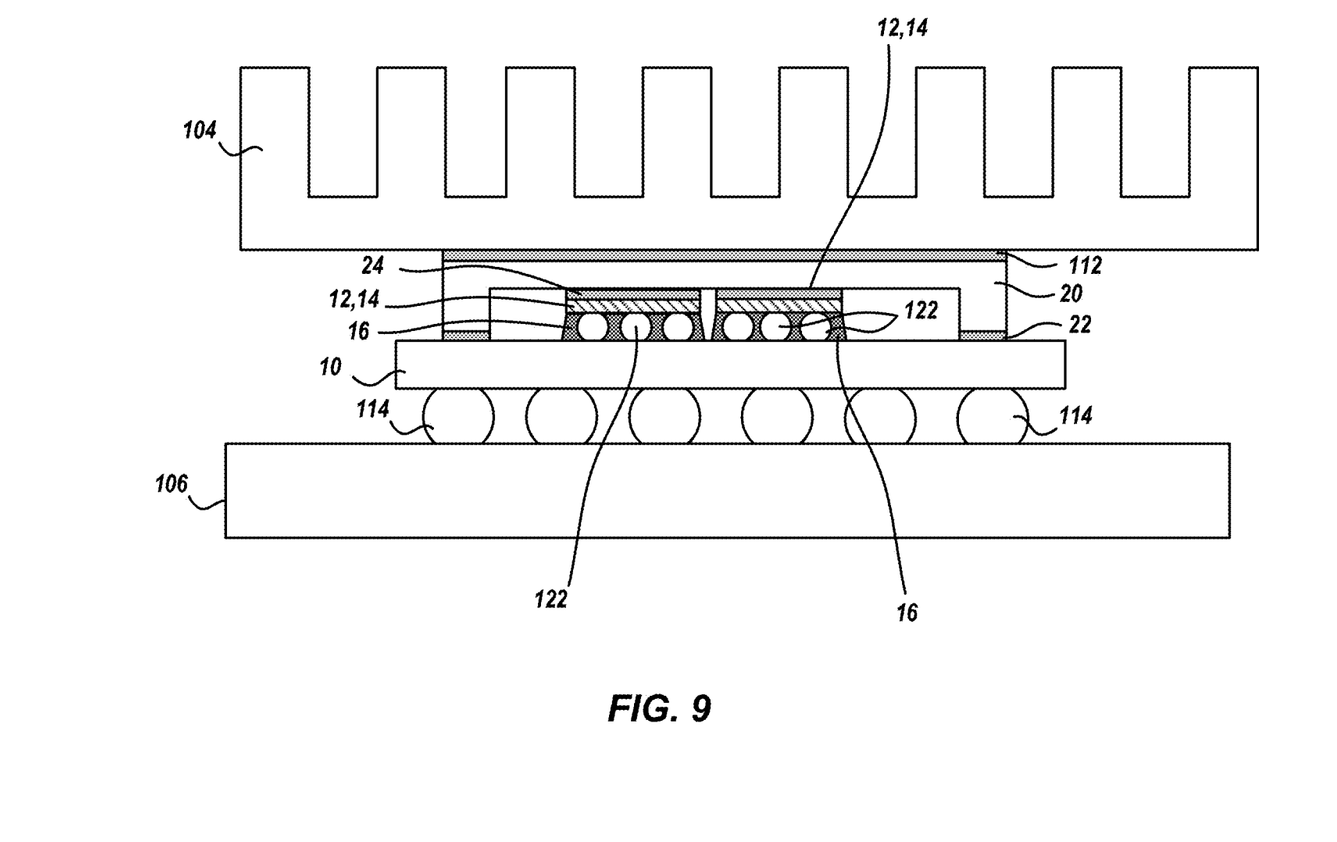
FIG. 9-FIG. 10 depict exemplary multi polygon die packages, in accordance with various embodiments of the present invention.

FIG. 9 depicts an exemplary multi polygon die package, in accordance with various embodiments of the present invention. Substrate 10 may be connected to a motherboard 106 via interconnects 114. Motherboard 106 may be the main printed circuit board of electronic device and includes electronic components, such as a memory, hard disk, flash memory, etc. and provides connectors for other peripherals. Interconnects 114 electrically connect the lower side of substrate 10 to motherboard 106 and may be a wire bond, solder bond, stud, pin, conductive ball, conductive button, etc. Interconnects 114 may be larger and thus more robust than interconnects 122 which connect die 12,14 to substrate 10, respectively.

To assist in the removal of heat from dies 12,14 a heat sink 104 may be thermally joined to lid 20 via thermal interface material 112. Heat sink 104 may be a passive heat exchanger that cools dies 12,14 by dissipating heat into the surrounding air. As such, during operation of electronic device, a thermal path exists from dies 12,14 to heat sink 104 through thermal interface material 24, lid 20, and thermal interface material 112, etc.

Interconnects 122 electrically connect dies 12,14 and substrate 10 and may be a wire bond, solder bond, stud, pin, conductive ball, conductive button, etc. In certain embodiments interconnects 122 may be solder joints composed of lead, lead-free, or a combination material. Underfill 16 may be electrically-insulating, may substantially surround interconnects 122, may isolate individual interconnects 122, and may provide mechanical support between dies 12,14 and substrate 10. Underfill 16 may also prevent damage to individual interconnects 122 due to thermal expansion mismatches between dies 12,14 and substrate 10. In certain embodiments, known epoxy or other resins may be used for underfill 16.

When dies 12,14 are seated upon substrate 10, a reflow process may be performed to join interconnects 122 to electrical contacts of respective dies 12,14 and substrate 10. After dies 12,14 are seated to substrate 10, lid 20 may be attached to substrate 10 with seal band 22. TIM 112 may be a compliant layer of thermal interface material to maintain a thermal path between lid 20 and heat sink 104. TIM 112 increases heat transfer from lid 20 and heat sink 104 by reducing air gaps there between. In certain embodiments, TIM 112 may be composed of polymeric base material such as, for example, silicone rubber mixed with aluminum particles and zinc oxide, though other specific materials may be utilized (e.g. thermal grease, thermal gel, thermal paste, etc.).

Figure 10:
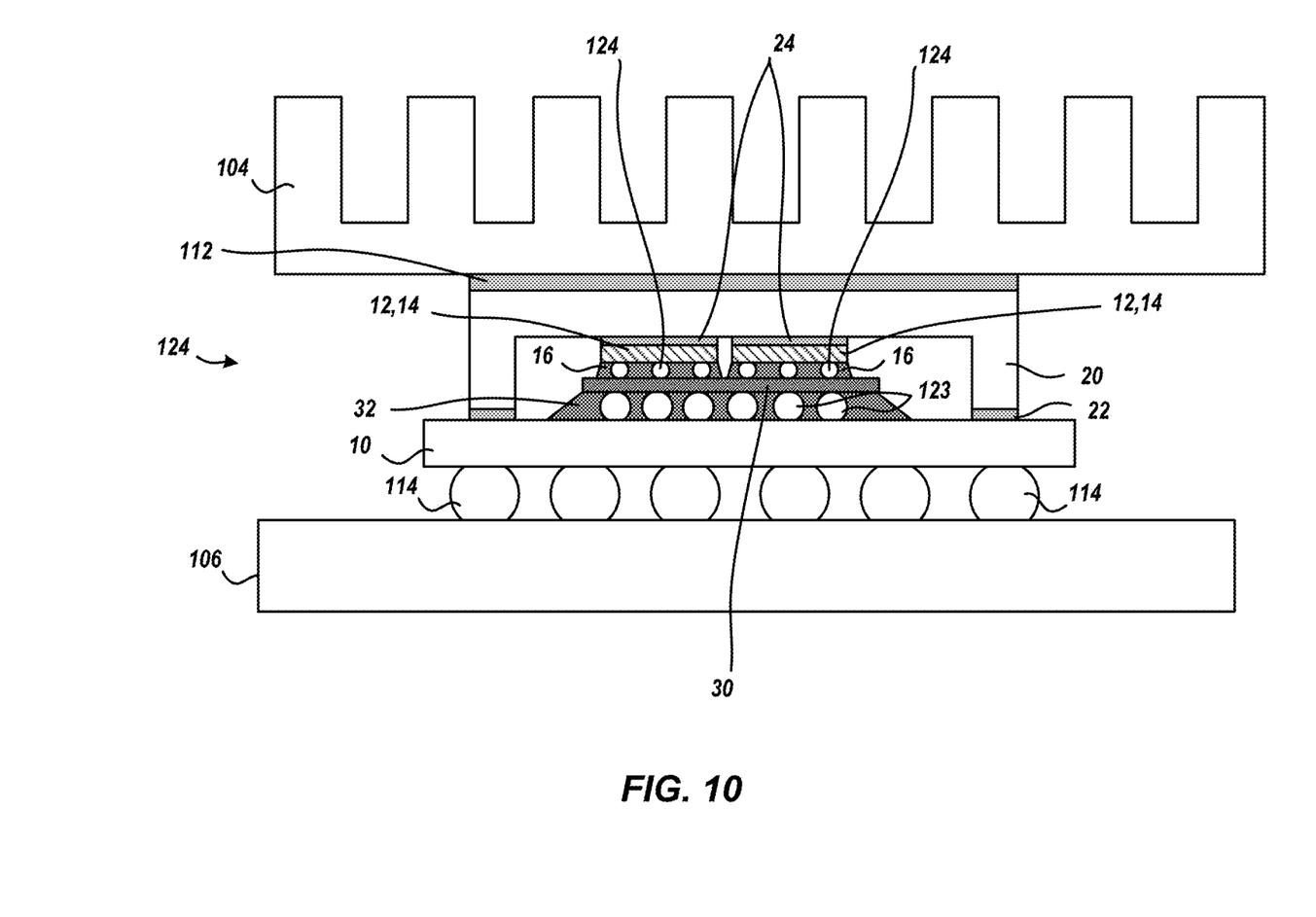

FIG. 10 depicts an exemplary multi polygon die package, in accordance with various embodiments of the present invention. Substrate 10 may be connected to a motherboard 106 via interconnects 114 and to interposer 30 via interconnects 123. Interconnects 123 electrically connect the upper side of substrate 10 to the lower side of interposer 30 and may be a wire bond, solder bond, stud, pin, conductive ball, conductive button, etc. In certain embodiments interconnects 123 may be solder joints composed of lead, lead-free, or a combination material. Underfill 32 may be electrically-insulating, may substantially surround interconnects 123, may isolate individual interconnects 123, and may provide mechanical support between interposer 30 and substrate 10. Underfill 32 may also prevent damage to individual interconnects 123 due to thermal expansion mismatches between interposer 30 and substrate 10. In certain embodiments, known epoxy or other resins may be used for underfill 32.

Interconnects 124 electrically connect dies 12,14 and interposer 30 and may be a wire bond, solder bond, stud, pin, conductive ball, conductive button, etc. In certain embodiments interconnects 124 may be solder joints composed of lead, lead-free, or a combination material. Underfill 16 may be electrically-insulating, may substantially surround interconnects 124, may isolate individual interconnects 124, and may provide mechanical support between dies 12,14 and interposer 30. Underfill 16 may also prevent damage to individual interconnects 124 due to thermal expansion mismatches between dies 12,14 and interposer 30.

Figure 11:
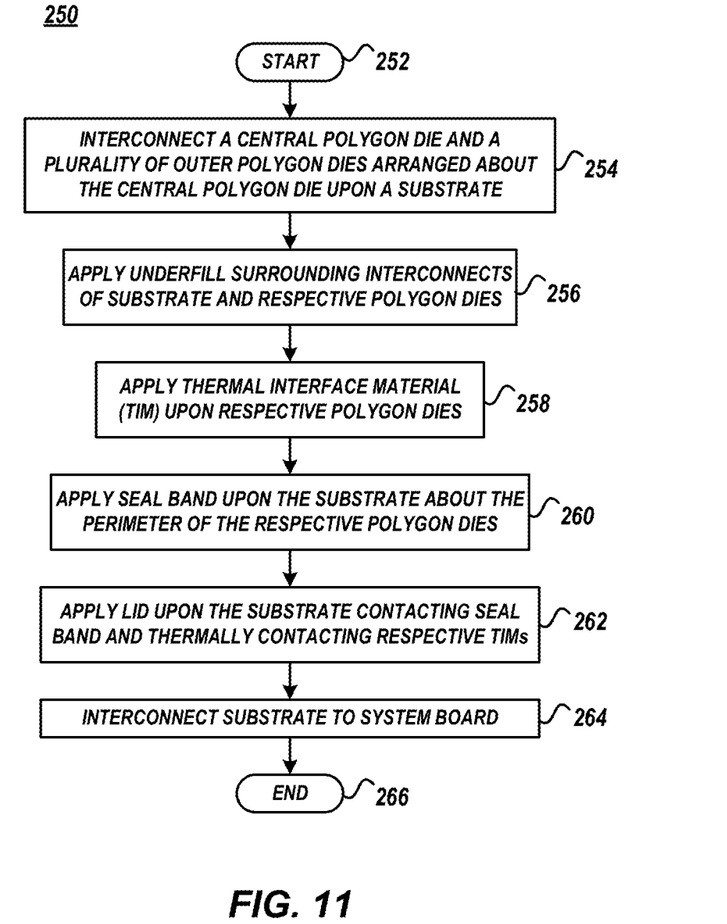
FIG. 11-FIG. 12 depicts a flow diagram of multi polygon die packaging methods, in accordance with various embodiments of the present invention.

FIG. 11 depicts a flow diagram of multi polygon die packaging method 250, in accordance with various embodiments of the present invention. Method 250 begins at block 252 and continues with interconnecting a central polygon die and a plurality of outer polygon dies arranged about the central polygon die upon a substrate (block 254). For example, central polygon die 12 is attached to substrate 10 via interconnects 122 and outer polygon dies 14 are attached to substrate via interconnects 122, respectively. In certain embodiments, the outer polygon dies 14 are arranged about the central polygon die such that an underfill-width "m" separates each outer polygon die 14 from the central polygon die 12.

Method 250 may continue by applying underfill surrounding the interconnection between the substrate and respective polygon dies (block 256). For example, underfill 16 may be applied between respective polygon dies 12,14 and substrate 10. Certain underfills 16 may be applied about the perimeter of dies 12,14 and capillary action draws the underfill 16 under polygon dies 12,14. Method 250 may continue by applying a TIM upon the upper surface of respective polygon dies (block 258). For example, TIM 24 may be applied upon the upper surface of polygon dies 12,14 or applied upon the underside of cover 20 in alignment with the respective polygon dies 12,14.

Method 250 may continue by applying a seal band upon the substrate about the perimeter of the respective polygon dies (block 260). For example, seal band 22 or other adhesive may be applied around the polygon dies 12,14 in alignment with cover 20. Method 250 may continue with applying a lid or cover to the substrate by contacting the seal band, the underside of the lid thermally contacting the respective TIMs (block 262). For example, lid 20 is applied to seal band 22 and thermally connected to respective TIMs 24 so that heat may be transferred from polygon dies 12,14 to cover 20. Method 250 may continue by interconnecting the substrate with a system board (block 264). For example, substrate 10 may be connected to motherboard 104 by interconnects 114. Method 250 ends at block 266.

Figure 12:
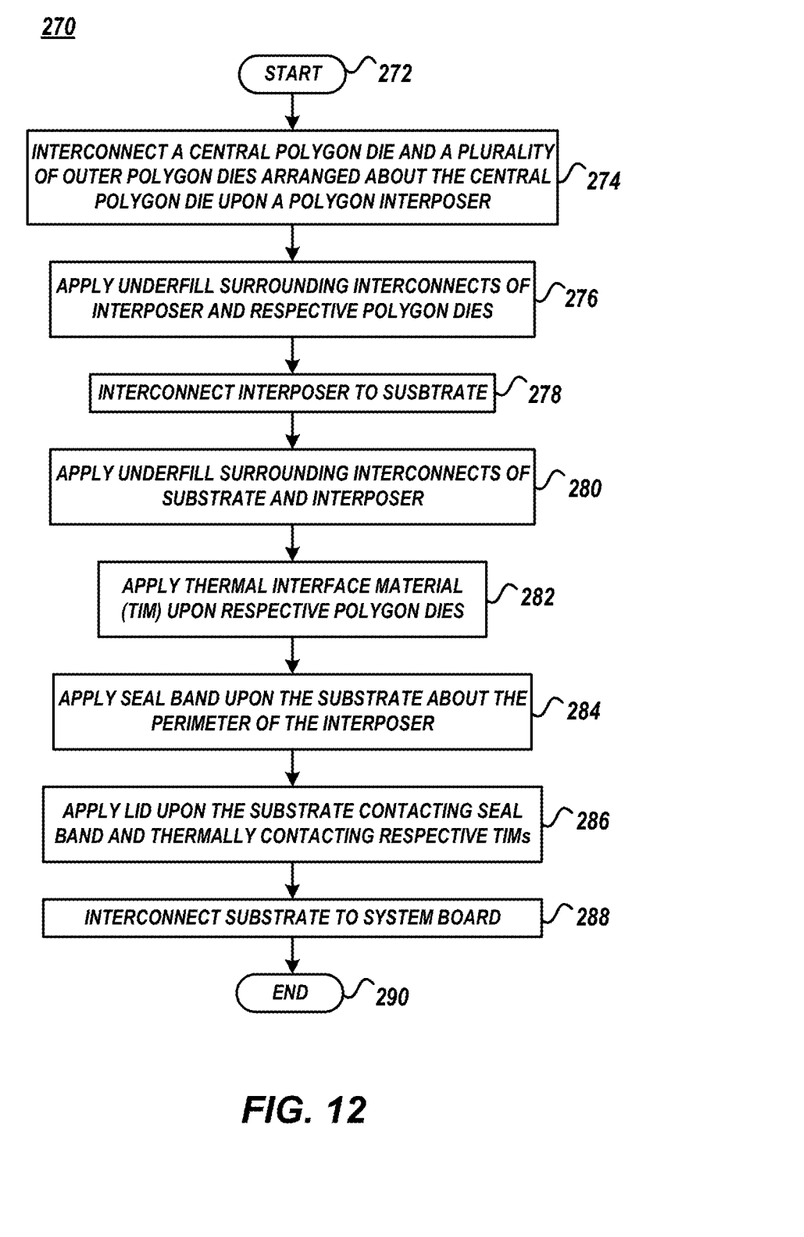

FIG. 12 depicts a flow diagram of multi polygon die packaging method 270, in accordance with various embodiments of the present invention. Method 270 begins at block 272 and continues with interconnecting a central polygon die and a plurality of outer polygon dies arranged about the central polygon die upon a polygon interposer (block 274). For example, central polygon die 12 is attached to interposer 30 via interconnects 124 and outer polygon dies 14 are attached to interposer 30 via interconnects 124, respectively. In certain embodiments, the outer polygon dies 14 are arranged about the central polygon die such that an underfill-width "m" separates each outer polygon die 14 from the central polygon die 12.

Method 270 may continue by applying underfill surrounding the interconnection between the interposer and respective polygon dies (block 276). For example, underfill 16 may be applied between respective polygon dies 12,14 and interposer 30.

Method 270 may continue by interconnecting the interposer to a substrate (block 278). For example, interposer 30 is attached to substrate 10 via interconnects 123. Method 270 may continue by applying underfill surrounding the interconnection between the interposer and substrate (block 280). For example, underfill 32 may be applied between interposer 30 and substrate 10. Certain underfills 32 may be applied about the perimeter of interposer 30 and capillary action draws the underfill 32 under the polygon interposer 30.

Method 270 may continue by applying a TIM upon the upper surface of respective polygon dies (block 282). For example, TIM 24 may be applied upon the upper surface of polygon dies 12,14 or applied upon the underside of cover 20 in alignment with the respective polygon dies 12,14. Method 270 may continue by applying a seal band upon the substrate about the perimeter of the polygon interposer (block 284). For example, seal band 22 or other adhesive may be applied around the interposer 30 in alignment with cover 20. Method 270 may continue with applying a lid or cover to the substrate by contacting the seal band, the underside of the lid thermally contacting the respective TIMs (block 286). For example, lid 20 is applied to seal band 22 and thermally connected to respective TIMs 24 so that heat may be transferred from polygon dies 12,14 to cover 20. Method 270 may continue by interconnecting the substrate with a system board (block 288). For example, substrate 10 may be connected to motherboard 104 by interconnects 114. Method 270 ends at block 290.

Figure 13:
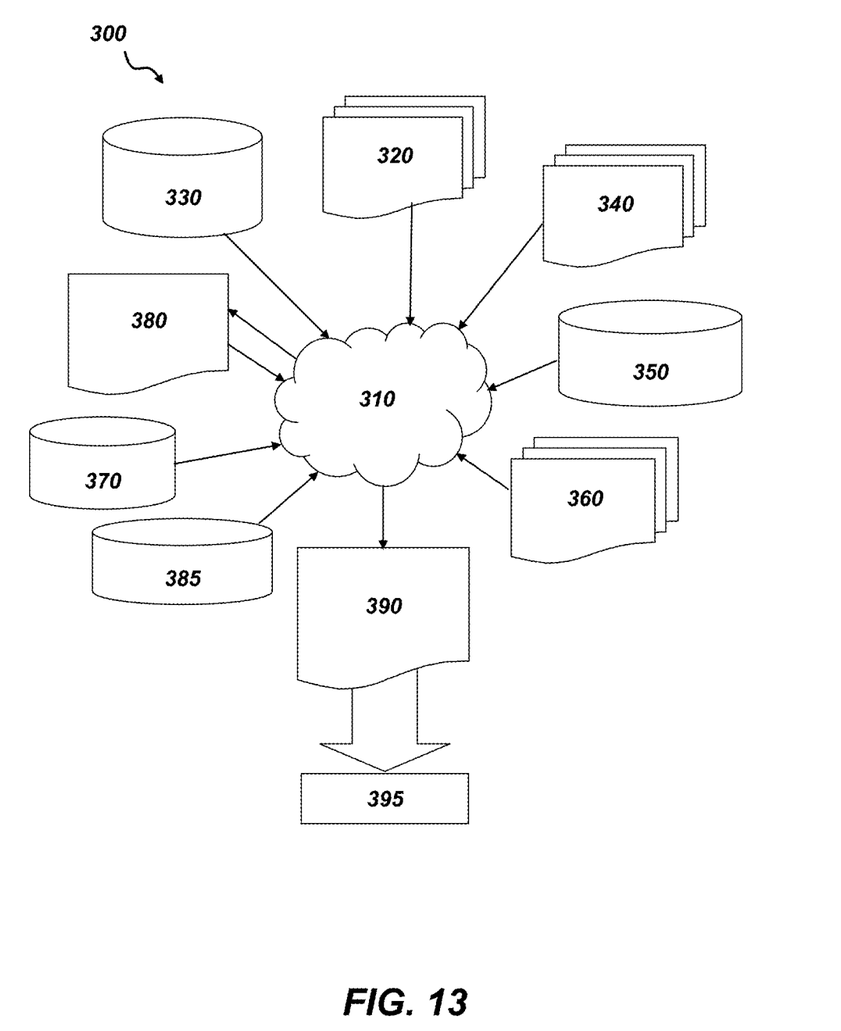
FIG. 13 depicts a flow diagram of a design process used in semiconductor design, manufacture, and/or test, in accordance with various embodiments of the present invention.

Referring now to FIG. 13, a block diagram of an exemplary design flow 300 used for example, in semiconductor integrated circuit (IC) logic design, simulation, test, layout, and/or manufacture is shown. Design flow 300 includes processes, machines and/or mechanisms for processing design structures or devices to generate logically or otherwise functionally equivalent representations of the structures and/or devices described above and shown in FIGS. 1-10.

The design structures processed and/or generated by design flow 300 may be encoded on machine-readable transmission or storage media to include data and/or instructions that when executed or otherwise processed on a data processing system generate a logically, structurally, mechanically, or otherwise functionally equivalent representation of hardware components, circuits, devices, or systems.

Machines include, but are not limited to, any machine used in an IC design process, such as designing, manufacturing, or simulating a circuit, component, device, or system. For example, machines may include: lithography machines, machines and/or equipment for generating masks (e.g. e-beam writers), computers or equipment for simulating design structures, any apparatus used in the manufacturing or test process, or any machines for programming functionally equivalent representations of the design structures into any medium (e.g. a machine for programming a programmable gate array).

Design flow 300 may vary depending on the type of representation being designed. For example, a design flow 300 for building an application specific IC (ASIC) may differ from a design flow 300 for designing a standard component or from a design flow 300 for instantiating the design into a programmable array, for example a programmable gate array (PGA) or a field programmable gate array (FPGA) offered by Altera® Inc. or Xilinx® Inc.

FIG. 13 illustrates multiple such design structures including an input design structure 320 that is preferably processed by a design process 310. Design structure 320 may be a logical simulation design structure generated and processed by design process 310 to produce a logically equivalent functional representation of a hardware device. Design structure 320 may also or alternatively comprise data and/or program instructions that when processed by design process 310, generate a functional representation of the physical structure of a hardware device. Whether representing functional and/or structural design features, design structure 320 may be generated using electronic computer-aided design (ECAD) such as implemented by a core developer/designer.

When encoded on a machine-readable data transmission, gate array, or storage medium, design structure 320 may be accessed and processed by one or more hardware and/or software modules within design process 310 to simulate or otherwise functionally represent an electronic component, circuit, electronic or logic module, apparatus, device, structure, or system such as those shown in FIGS. 1-10. As such, design structure 320 may comprise files or other data structures including human and/or machine-readable source code, compiled structures, and computer-executable code structures that when processed by a design or simulation data processing system, functionally simulate or otherwise represent circuits or other levels of hardware logic design. Such data structures may include hardware-description language (HDL) design entities or other data structures conforming to and/or compatible with lower-level HDL design languages such as Verilog and VHDL, and/or higher level design languages such as C or C++.

Design process 310 preferably employs and incorporates hardware and/or software modules for synthesizing, translating, or otherwise processing a design/simulation functional equivalent of the components, circuits, devices, or structures shown FIGS. 1-10. to generate a Netlist 380 which may contain design structures such as design structure 320. Netlist 380 may comprise, for example, compiled or otherwise processed data structures representing a list of wires, discrete components, logic gates, control circuits, I/O devices, models, etc. that describes the connections to other elements and circuits in an integrated circuit design. Netlist 380 may be synthesized using an iterative process in which netlist 380 is resynthesized one or more times depending on design specifications and parameters for the device. As with other design structure types described herein, netlist 380 may be recorded on a machine-readable data storage medium or programmed into a programmable gate array. The storage medium may be a non-volatile storage medium such as a magnetic or optical disk drive, a programmable gate array, a compact flash, or other flash memory. Additionally, or in the alternative, the storage medium may be a system or cache memory, buffer space, or electrically or optically conductive devices in which data packets may be intermediately stored.

Design process 310 may include hardware and software modules for processing a variety of input data structure types including Netlist 380. Such data structure types may reside, for example, within library elements 330 and include a set of commonly used elements, circuits, and devices, including models, layouts, and symbolic representations, for a given manufacturing technology (e.g., different technology nodes, 14, 32 nm, 45 nm, 90 nm, etc.). The data structure types may further include design specifications 340, characterization data 350, verification data 360, design rules 370, and test data files 385 which may include input test patterns, output test results, and other testing information. Design process 310 may further include, for example, standard mechanical design processes such as stress analysis, thermal analysis, mechanical event simulation, process simulation for operations such as casting, molding, and die press forming, etc.

One of ordinary skill in the art of mechanical design can appreciate the extent of possible mechanical design tools and applications used in design process 310 without deviating from the scope and spirit of the invention claimed herein. Design process 310 may also include modules for performing standard circuit design processes such as timing analysis, verification, design rule checking, place and route operations, etc.

Design process 310 employs and incorporates logic and physical design tools such as HDL compilers and simulation model build tools to process design structure 320 together with some or all of the depicted supporting data structures along with any additional mechanical design or data (if applicable), to generate a second design structure 390. Design structure 390 resides on a storage medium or programmable gate array in a data format used for the exchange of data of mechanical devices and structures (e.g. information stored in a IGES, DXF, Parasolid XT, JT, DRG, or any other suitable format for storing or rendering such mechanical design structures).

Similar to design structure 320, design structure 390 preferably comprises one or more files, data structures, or other computer-encoded data or instructions that reside on transmission or data storage media and that when processed by an ECAD system generate a logically or otherwise functionally equivalent form of one or more of the embodiments of the invention shown in FIGS. 1-10. In one embodiment, design structure 390 may comprise a compiled, executable HDL simulation model that functionally simulates the devices shown in FIGS. 1-10.

Design structure 390 may also employ a data format used for the exchange of layout data of integrated circuits and/or symbolic data format (e.g. information stored in a GDSII (GDS2), GL1, OASIS, map files, or any other suitable format for storing such design data structures). Design structure 390 may comprise information such as, for example, symbolic data, map files, test data files, design content files, manufacturing data, layout parameters, wires, levels of metal, vias, shapes, data for routing through the manufacturing line, and any other data required by a manufacturer or other designer/developer to produce a device or structure as described above and shown in FIGS. 1-10. Design structure 390 may then proceed to a stage 395 where, for example, design structure 390: proceeds to tape-out, is released to manufacturing, is released to a mask house, is sent to another design house, is sent back to the customer, etc.

The accompanying figures and this description depicted and described embodiments of the present invention, and features and components thereof. Those skilled in the art will appreciate that any particular nomenclature used in this description was merely for convenience, and thus the invention should not be limited by the specific process identified and/or implied by such nomenclature. Therefore, it is desired that the embodiments described herein be considered in all respects as illustrative, not restrictive, and that reference be made to the appended claims for determining the scope of the invention.

The exemplary methods and techniques described herein may be used in the fabrication of integrated circuit chips. The resulting integrated circuit chips can be distributed by the fabricator in raw wafer form (i.e., as a single wafer that has multiple unpackaged chips), as a bare die, or in a packaged form. In the latter case, the chip is mounted in a single chip package (e.g., a plastic carrier, with leads that are affixed to a motherboard or other higher level carrier) or in a multichip package (e.g., a ceramic carrier that has either or both surface interconnections or buried interconnections). The chip is then integrated with other chips, discrete circuit elements and/or other signal processing devices as part of either (a) an intermediate product, such as a motherboard, or (b) an end product. The end product can be any product that includes integrated circuit chips, ranging from toys and other low-end applications to advanced computer products having numerous components, such as a display, a keyboard or other input device and/or a central processor, as non-limiting examples.

References herein to terms such as "vertical", "horizontal", etc. are made by way of example, and not by way of limitation, to establish a frame of reference. The term "horizontal" as used herein is defined as a plane parallel to the conventional plane or surface of the system board. The term "vertical" refers to a direction perpendicular to the horizontal, as just defined. Terms, such as "on", "above", "below", "side", "higher", "lower", "over", "beneath", "upper", "lower", "under", etc. are defined with respect to the horizontal plane. It is understood that various other frames of reference may be employed for describing the present invention without departing from the spirit and scope of the present invention.

The invention claimed is:

1. A multi-die packaging method comprising:
    interconnecting, with first level solder interconnects, a central hexagon die to an upper surface of a hexagon interposer substrate;
    interconnecting, with first level solder interconnects, a plurality of outer hexagon dies to the upper surface of the hexagon interposer substrate arranged about the central hexagon die;
    applying a central underfill between the central hexagon die and the hexagon interposer substrate and applying a outer underfill between each of the outer hexagon dies and the hexagon interposer substrate,
    wherein a same underfill-width separates the central hexagon die from each of the plurality of outer hexagon dies such that the central underfill does not contact any outer underfills and wherein the same underfill-width separate each adjacent outer hexagon die such that outer underfills associated with each adjacent outer hexagon dies do not contact;
    interconnecting, with second level solder interconnects, a lower surface of the hexagon interposer substrate to an upper surface of a planar interposer substrate;
    applying a second level underfill between the hexagon interposer substrate and the planar interposer substrate surrounding the second level solder interconnects;
    applying a thermal interface material (TIM) upon the central hexagon die and upon each of the plurality of outer hexagon dies;
    applying a seal band upon the upper surface of the planar interposer substrate about the perimeter of the second level solder interconnects;
    applying a lid to the seal band, the applied lid in contact with each respective TIM; and
    interconnecting, with third level solder interconnects, a lower surface of the planar interposer substrate to an upper surface of a motherboard substrate.

2. A multi-die package comprising:
    a central hexagon die upon a hexagon interposer substrate;
    a plurality of outer hexagon dies upon the hexagon interposer substrate arranged about the central hexagon die;
    first level solder interconnects interconnecting the central hexagon die and an upper surface of the hexagon interposer substrate and interconnecting each of the plurality of outer hexagon dies and the upper surface of the hexagon interposer substrate;
    central underfill between the central hexagon die and the hexagon interposer substrate and around the first level solder interconnects interconnecting the central hexagon die and the hexagon interposer substrate;
    outer underfill between each of the outer hexagon dies and the hexagon interposer substrate and around the first level solder interconnects interconnecting respective outer hexagon dies and the hexagon interposer substrate,
    wherein a same underfill-width separates the central hexagon die from each of the plurality of outer hexagon dies such that the central underfill does not contact any outer underfills and wherein the same underfill-width separate each adjacent outer hexagon die such that outer underfills associated with each adjacent outer hexagon dies do not contact;
    a planar interposer substrate and a motherboard substrate;
    second level solder interconnects interconnecting a lower surface of the hexagon interposer substrate to an upper surface of the planar interposer substrate second level underfill between the hexagon interposer substrate and the planar interposer substrate surrounding the second level interconnects;
    third level solder interconnects interconnecting a lower surface of the planar interposer substrate to an upper surface of the mother board substrate;
    a thermal interface material (TIM) upon the central hexagon die and upon each of the plurality of outer hexagon dies;
    a seal band upon the upper surface of the planar interposer substrate about the perimeter of the second level solder interconnects; and
    a lid that contacts the seal band and contacts each respective TIM.

* * * * *